(12) United States Patent
Kruip

(10) Patent No.: US 7,714,580 B2
(45) Date of Patent: May 11, 2010

(54) SHIM FOR IMAGING MAGNETS

(75) Inventor: Marcel Jan Marie Kruip, Oxford (GB)

(73) Assignee: Siemens Plc, Frimley, Camberley (GB)

( * ) Notice: Subject to any disclaimer, the term of this patent is extended or adjusted under 35 U.S.C. 154(b) by 230 days.

(21) Appl. No.: 12/043,638

(22) Filed: Mar. 6, 2008

(65) Prior Publication Data
US 2008/0258729 A1 Oct. 23, 2008

(30) Foreign Application Priority Data
Apr. 18, 2007 (GB) ................. 0707485.9

(51) Int. Cl.
*G01V 3/00* (2006.01)

(52) U.S. Cl. ...................... 324/320; 324/318

(58) Field of Classification Search ......... 324/300–345; 600/407–445; 335/300, 299; 128/653.2, 128/653.5; 250/290
See application file for complete search history.

(56) References Cited

U.S. PATENT DOCUMENTS

| | | | | |
|---|---|---|---|---|
| 5,400,786 A | * | 3/1995 | Allis | ........................... 335/299 |
| 5,646,532 A | * | 7/1997 | Knuttel et al. | ............... 324/321 |
| 6,147,495 A | * | 11/2000 | DeMeester et al. | .......... 324/320 |
| 6,462,548 B1 | | 10/2002 | Havens | |
| 6,822,451 B2 | * | 11/2004 | Hollis | ........................ 324/319 |
| 2004/0021465 A1 | * | 2/2004 | Hollis | ........................ 324/318 |
| 2007/0052419 A1 | | 3/2007 | Overweg | |
| 2007/0171014 A1 | * | 7/2007 | Iwasa et al. | ................. 335/216 |
| 2009/0261246 A1 | * | 10/2009 | Neuberth et al. | ............ 250/290 |

FOREIGN PATENT DOCUMENTS

| | | |
|---|---|---|
| GB | 2 408 583 A | 6/2005 |
| WO | WO 2006/088453 A1 | 8/2006 |

OTHER PUBLICATIONS

Great Britain Search Report dated Jun. 29, 2007 (one (1) page).

* cited by examiner

*Primary Examiner*—Brij B Shrivastav
(74) *Attorney, Agent, or Firm*—Crowell & Moring LLP

(57) ABSTRACT

An arrangement for producing an imaging region of increased maximum radial diameter in a magnetic resonance imaging (MRI) system, comprising a solenoidal magnet arrangement (30) comprising primary magnet coils (32) arranged symmetrically about an axis (A-A) and a shim coil set.

11 Claims, 11 Drawing Sheets

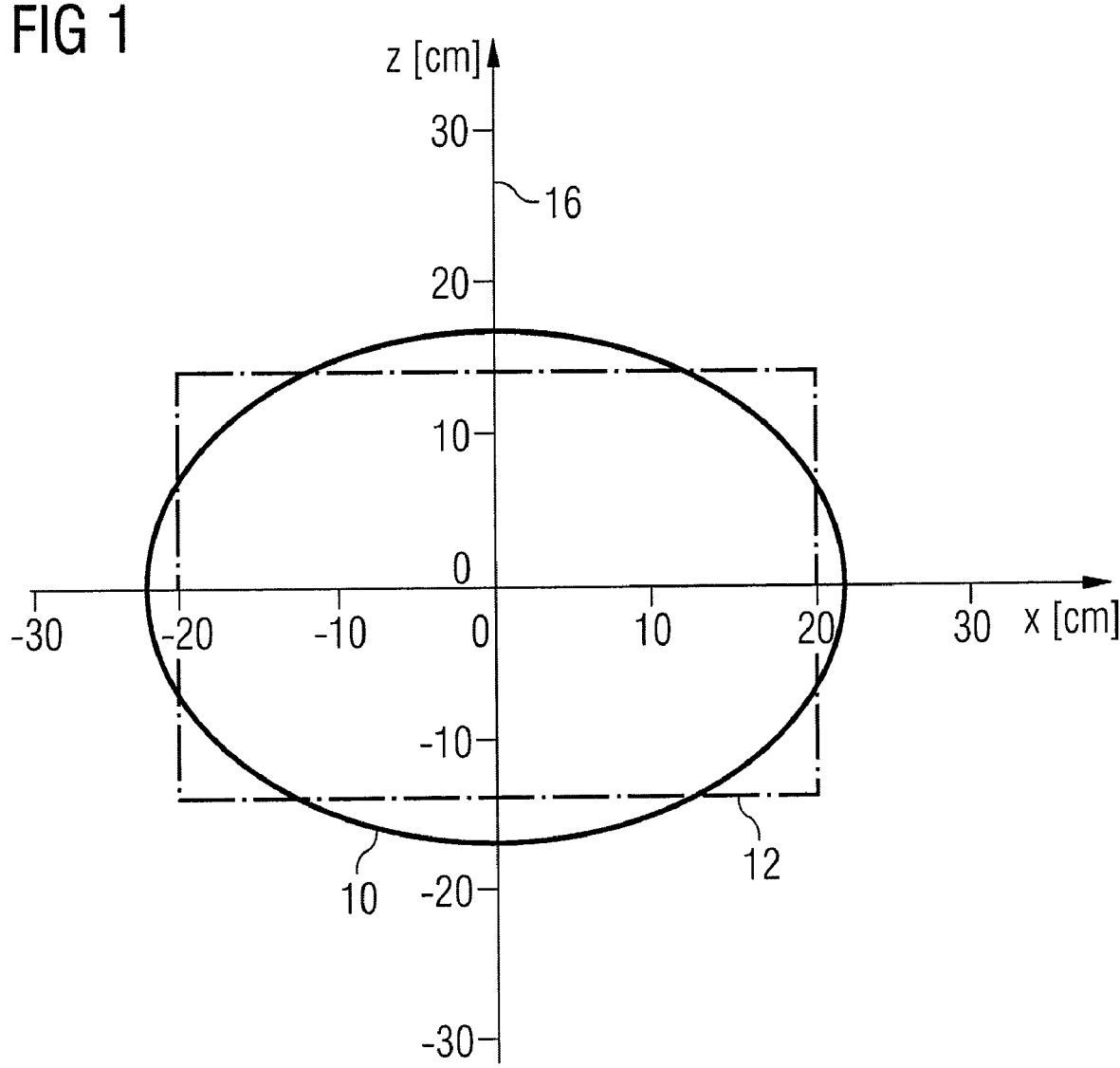

Current distribution +ve z

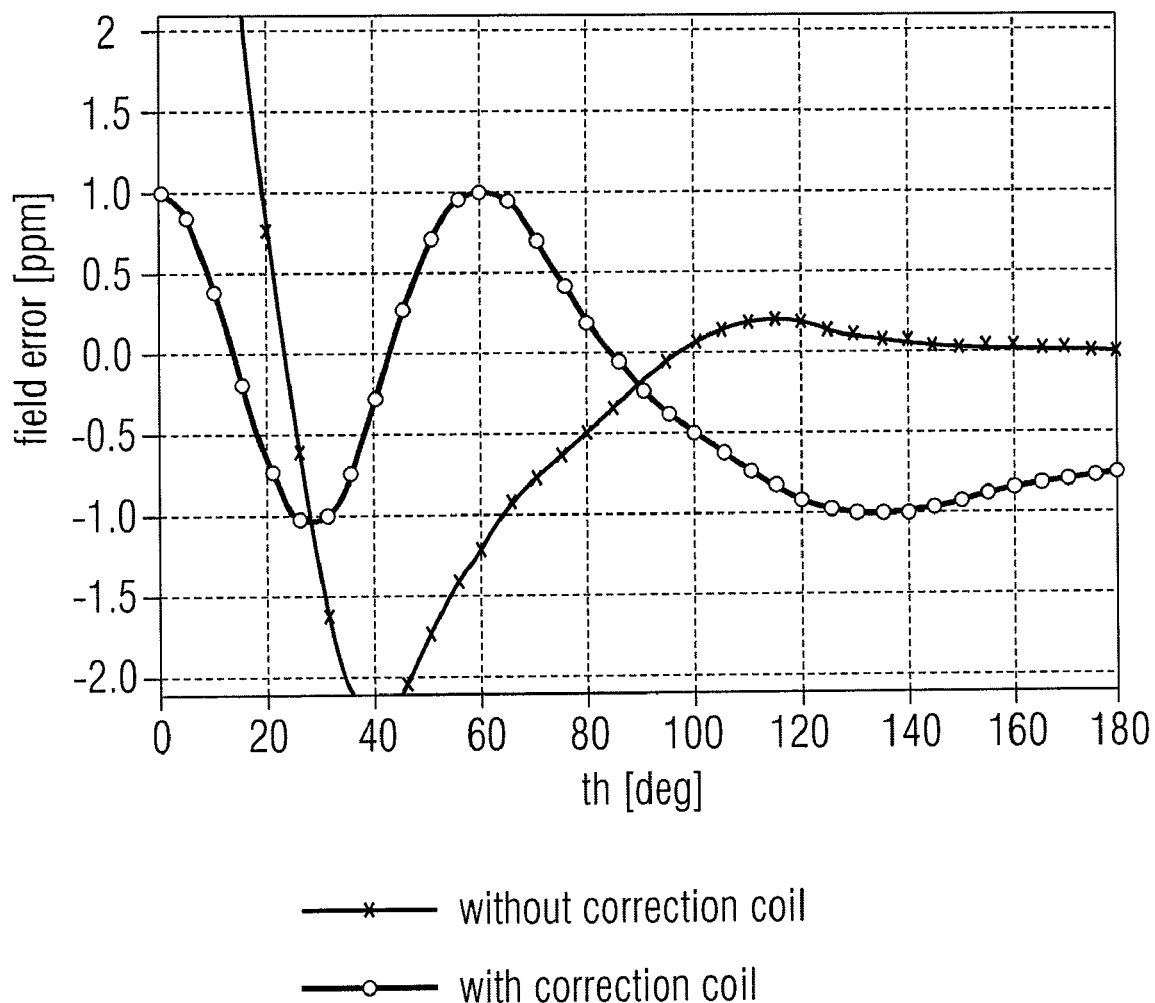

SHIM FOR IMAGING MAGNETS

FIELD OF THE INVENTION

This invention concerns an arrangement for providing a toroidal volume of a magnetic field of sufficient homogeneity to allow magnetic resonance imaging ("MRI") in an MRI apparatus with an axisymmetric magnet, and apparatus for providing such toroidal volume in an MRI apparatus which otherwise produces a substantially cylindrical imaging volume.

BACKGROUND OF THE INVENTION

The following description makes specific reference to axisymmetric cylindrical systems using solenoidal magnet arrangements. The terms "radial", "axial" and the like should be interpreted accordingly, unless the context requires otherwise.

The size and shape of the imaging volume of an MRI imaging system is an important driver in the design and cost of a magnet for such a system. The size and shape of the imaging volume also known as the field-of-view (FOV) can be defined by a homogeneity contour, such as the 3 ppm pk-pk contour, depending on the type of imaging required. The required radial diameter of the imaging volume is often determined by the requirement for shoulder and breast imaging. To achieve imaging volumes with sufficient radial width, magnet designers typically target a radially distended, oblate ellipsoidal imaging volume in their design.

However, there is also a demand for imaging volumes of a cylindrical shape, which are advantageous in the imaging of large areas, such as the abdomen. It is presently known to effectively achieve such cylindrical imaging volumes by joining two images each derived from an oblate ellipsoidal imaging volume, taken with the patient moved along the axis of the magnet, in the post processing stage of the imaging procedure. The use of a substantially cylindrical imaging region has the advantage that, for a given volume of the FOV, a composite image of the human abdominal region may be formed with less patient table moves than with a FOV of more conventional elliptical shape.

FIG. 1 shows example cross-sections of a presently achievable oblate ellipsoid imaging volume 10, and a presently achievable cylindrical imaging region 12 of the same volume, each being defined lying within an appropriate homogeneity contour. Note that the patient is aligned with the spine parallel to the Z axis 16 of the magnet. The ellipsoidal imaging volume 10 has an axial length z of approximately 35 cm and a radial diameter x of about 44 cm. The cylindrical imaging region 12 has an axial length z of approximately 28 cm and a radial diameter x of about 40 cm.

A possible disadvantage of such a cylindrical FOV 12 is that human shoulder areas may at least partially fall outside of the cylindrical FOV, as can be appreciated by comparing FIGS. 2A and 2B, which show views of a toroidal volume 14, in which imaging is required to be possible, relative to a cylindrical FOV 12 and an elliptical FOV 10. This is a particular issue for magnets with a limited radial width of FOV.

When a shoulder image is required in an MRI system with a FOV of limited radial width, such as the cylindrical imaging volume 12 of FIGS. 1, 2, the homogeneity can be restored by a local, passive shim. This has been shown to work, but is cumbersome and requires manual intervention for mounting and removing the passive shim.

It has been found theoretically possible to arrange for electrically operated shim coils to be switchable to convert a nominal ellipsoidal imaging volume 10, capable of imaging in toroidal volume, into a cylindrical imaging volume 12 with the same volume as the ellipsoidal imaging volume 10 and useful for imaging the abdomen. However, as illustrated in FIG. 1, this will result in a cylindrical imaging volume 12 with less radial width x than the equivalent ellipsoid volume 10. The ellipsoidal imaging volume 10, and the magnet to produce it, is typically designed to have a maximum radial diameter x sufficient to accommodate a patient's shoulders. As the cylindrical volume 12, adapted from the ellipsoid volume 10, has a reduced radial diameter x, the cylindrical volume will miss a significant part of the shoulder volume which is included within the ellipsoid volume 10. Although theoretically possible, the shim coils required to achieve this field adjustment have been found to be impractically large.

The present invention aims to address the above-mentioned difficulties, to provide a practical arrangement for generating an imaging volume of increased maximum radial diameter for a given MRI imaging system, by adaptation of a nominally substantially cylindrical imaging region.

An active, resistive shim coil has been considered which would change the imaging volume from a nominally cylindrical volume to an elliptical one suitable for imaging the toroidal volume, but such a shim is considered to be impractical, because of the amount of electrical power required. A resistive shim which specifically targets the toroidal volume, by deformation of a nominally substantially cylindrical imaging region is shown to be practical, according to the present invention. Such a shim coil will be referred to herein as a toroidal shim.

Accordingly, the present invention provides arrangements and methods as defined in the appended claims.

The above, and further, objects, characteristics and advantages of the present invention will become more apparent from the following description of certain embodiments thereof, given by way of examples only, in conjunction with the appended drawings, wherein:

FIG. 1 shows a conventional radially distended oblate ellipsoidal imaging region and a conventional cylindrical imaging region of an MRI imaging system;

FIG. 10C shows the improvement in magnetic field homogeneity within a toroidal volume by use of an active shim according to an embodiment of the present invention, in another format;

DESCRIPTION OF THE INVENTION

The present invention provides an arrangement allowing the imaging of shoulders in a cylindrical magnet with an imaging volume which is limited in the radial direction. This is arranged by a shim arrangement which, in operation, adapts a nominally substantially cylindrical imaging region to provide a substantially toroidal imaging region of increased maximum radial diameter and of sufficient homogeneity for imaging.

In certain preferred embodiments, the present invention provides an active toroidal shim composed of one or more resistive shim coils, which serves to improve the homogeneity in the toroidal volume 14 of the FOV when applied to a cylindrical magnet having a nominally cylindrical FOV. In certain embodiments, the same shim serves to improve magnetic field homogeneity in the spine region, when the shim carries a current in the reverse direction as compared to its use for imaging the toroidal volume.

Figure 4:
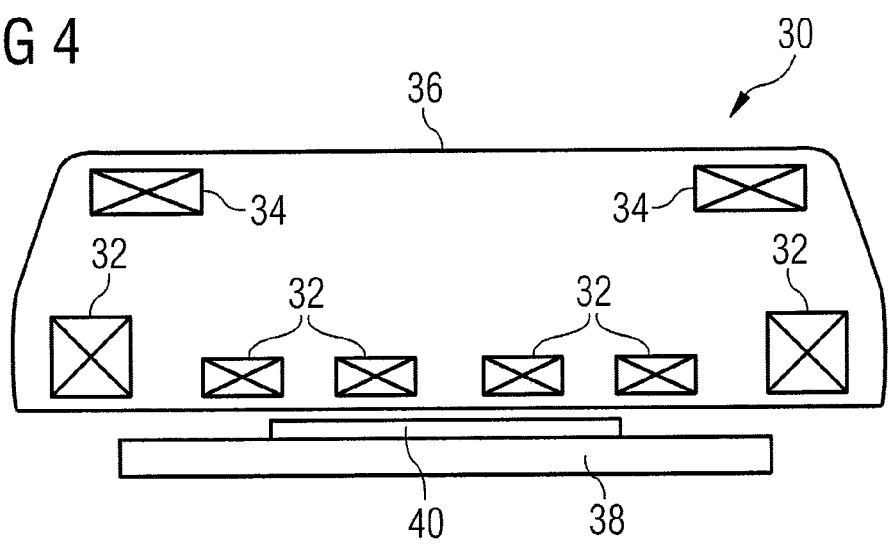
FIG. 4 shows a half-cross-sectional view of an axisymmetric cylindrical magnet for MRI imaging.

FIG. 4 shows a simplified axial half-cross-sectional view of the magnet arrangement of a conventional magnetic resonance imaging (MRI) system, suitable for modification according to the present invention. Only the principal components of the magnet system are shown, and many other components, as known to those skilled in the art, will be included in such an arrangement but are not illustrated, for clarity's sake.

A solenoidal magnet arrangement 30 is shown, which is symmetrical about axis A-A. Primary magnet coils 32 and active shielding coils 34 are arranged on a former (not shown) within a cryostat 36. A cylindrical gradient coil assembly 38 is provided, within a bore of the cryostat. The gradient coil assembly typically includes a plurality of gradient coils, and frequently houses active or passive shims as required to produce an optimal homogeneity in the magnetic field produced by the primary and shield coils. A body or RF coil 40 is provided, for imaging. It is typically cylindrical and located between an outer surface of the gradient coil assembly 38 and the outer surface of the cryostat bore.

Figure 2A:
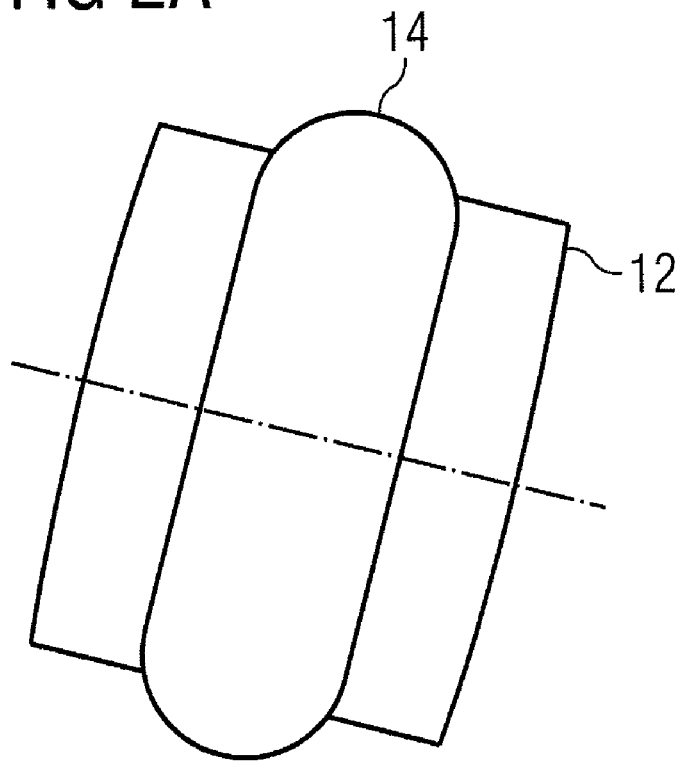
FIGS. 2A and 2B show conventional nominally cylindrical, and nominally ellipsoidal, imaging regions, respectively, in relation to a toroidal volume required for imaging.
Figure 2B:
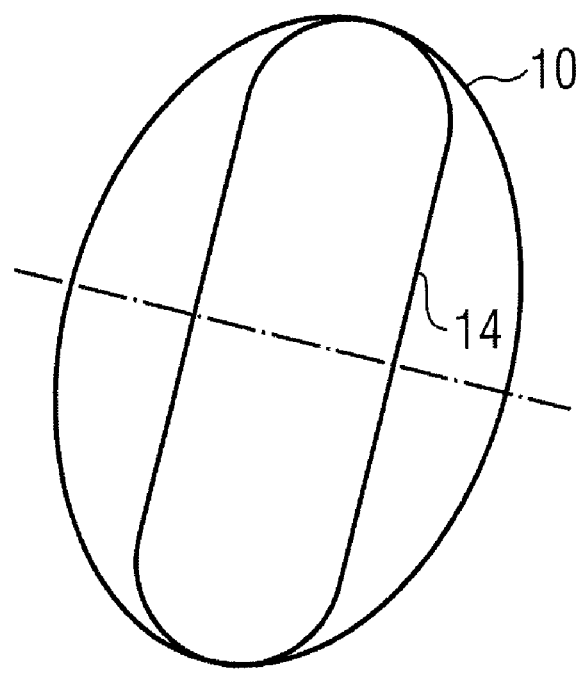
Figure 3:
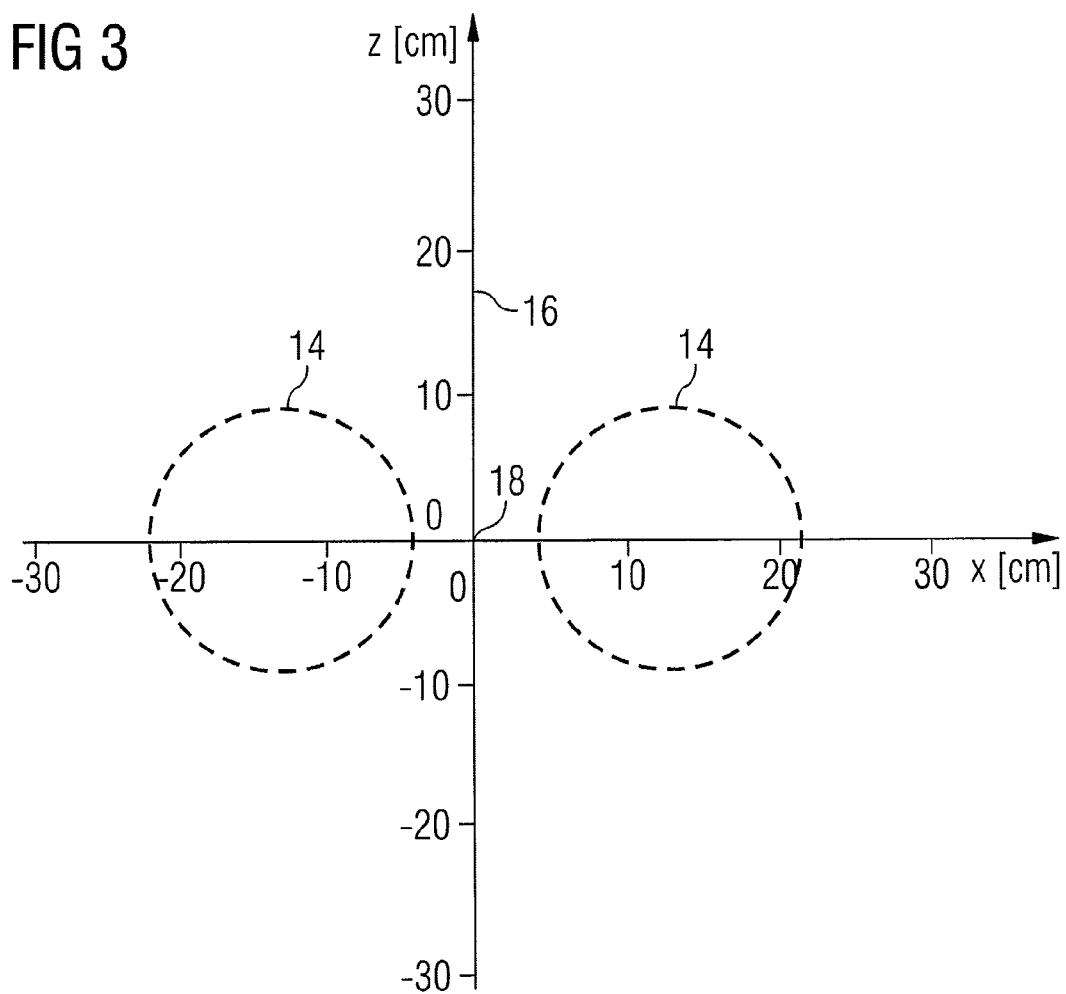
FIG. 3 shows a target toroidal imaging volume of an MRI imaging system, according to the present invention.

FIG. 3 shows a toroidal imaging region 14, defined within the ±2 ppm homogeneity contour, which may be produced according to the present invention. The imaging region 14 is toroidal, with rotational symmetry about the Z axis 16. As can be seen from a comparison of FIGS. 1 and 3, the toroidal imaging region 14 of FIG. 3, according to the present invention, has a maximum radial diameter x as large as that provided by the ellipsoidal imaging region 10 of the prior art and larger than that of the substantially cylindrical imaging region 12 of the prior art. This is more clearly illustrated in FIGS. 2A and 2B. The toroidal shim of the present invention modifies the homogeneity of the magnetic field so as to provide throughout the toroidal volume, a sufficiently homogeneous magnetic field to perform imaging.

With the toroidal shim of the present invention in use modifying a nominally cylindrical homogeneous region, the maximum radial diameter of the homogeneous region increases sufficiently to include the toroidal volume 14 illustrated in FIG. 3, at the expense of deterioration of the homogeneity at its centre 18. However, this is unimportant for the imaging of human shoulders and other subjects radially displaced away from the axis 16.

Figure 5:
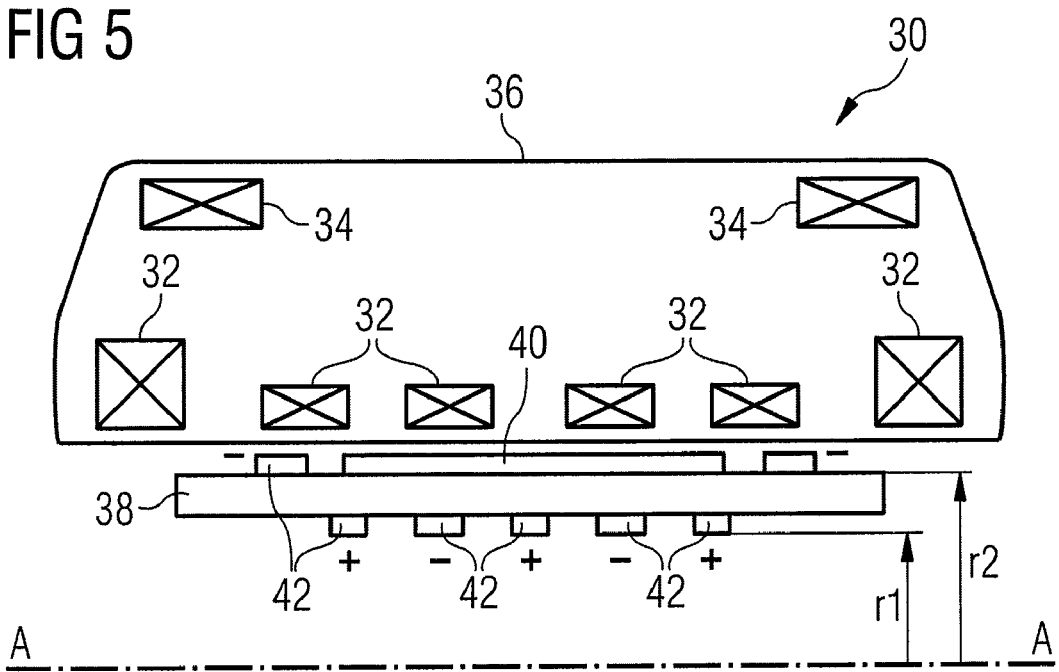
FIG. 5 shows the magnet of FIG. 4, modified according to an embodiment of the present invention.

FIG. 5 shows a simplified axial half-cross-sectional view of an axially symmetric magnet arrangement of a magnetic resonance imaging (MRI) system, modified according to the present invention. Only the principal components of the magnet system are shown, and many other components, as known to those skilled in the art, will be included in such an arrangement but are not illustrated, for clarity's sake. Those features common with FIG. 4 carry common reference numerals.

An example of apparatus provided by the present invention consists of a number of axially symmetric shim coils 42, located on the inside diameter of the gradient coil assembly 38 and some wound on the on the outside of the gradient coil assembly.

According to an embodiment of the present invention, a number of shim coils 42 are provided as shown. Each has a polarity indicator + or − indicating the direction of current flow in the respective coil, in use. The illustrated embodiment has coils of alternating coil current flow polarity. However, this is not necessarily the case, and other embodiments may not have the alternating coil current flow polarity. Coils having both forward and reverse current flow will, however, typically be required.

While the illustrated coil positions and polarities are schematic only, those of skill in the art will be able to determine an optimum combination of coil sizes, positions and current polarities using one of the optimization computer programs commonly used in the art.

The inventor has, however, found that operation according to the present invention is assisted by using coils 42 of at least two differing internal radii r1 and r2. As illustrated in FIG. 5, these differing radii may conveniently be arranged on radially inner and outer surfaces of the gradient coil assembly 38. Alternatively, the coils of the active shim of the present invention may be embedded within the gradient coil assembly, preferably displaced towards radially inner and outer surfaces, respectively.

While the example illustrated in FIG. 5 shows only solenoidal, axisymmetric coils, other embodiments may use so-called saddle coils—three dimensional coils formed of arcuate pieces joined by parallel straight pieces to form a saddle shape, as known to those skilled in the art. Solenoidal, axisymmetric coils are however preferred since they can easily be produced as part of the manufacturing process of the gradient coil assembly.

Figure 6:
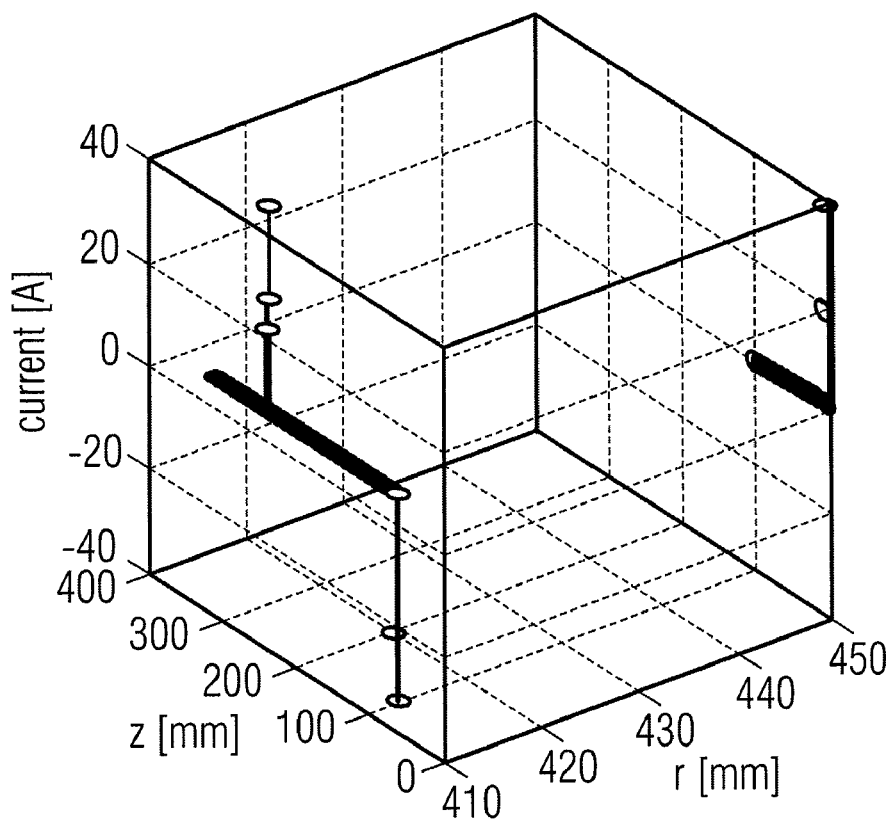
FIG. 6 shows a current distribution according to a stage in the design process of an active shim according to an embodiment of the present invention.

FIG. 6 shows a current distribution for an embodiment of the present invention. An example of a method used to arrive at such a distribution is described in more detail below. The distribution includes points of high positive current, and points of high negative current. By placing coils at the corresponding locations and causing a corresponding current to flow through them, such an embodiment may be realized.

Figure 7:
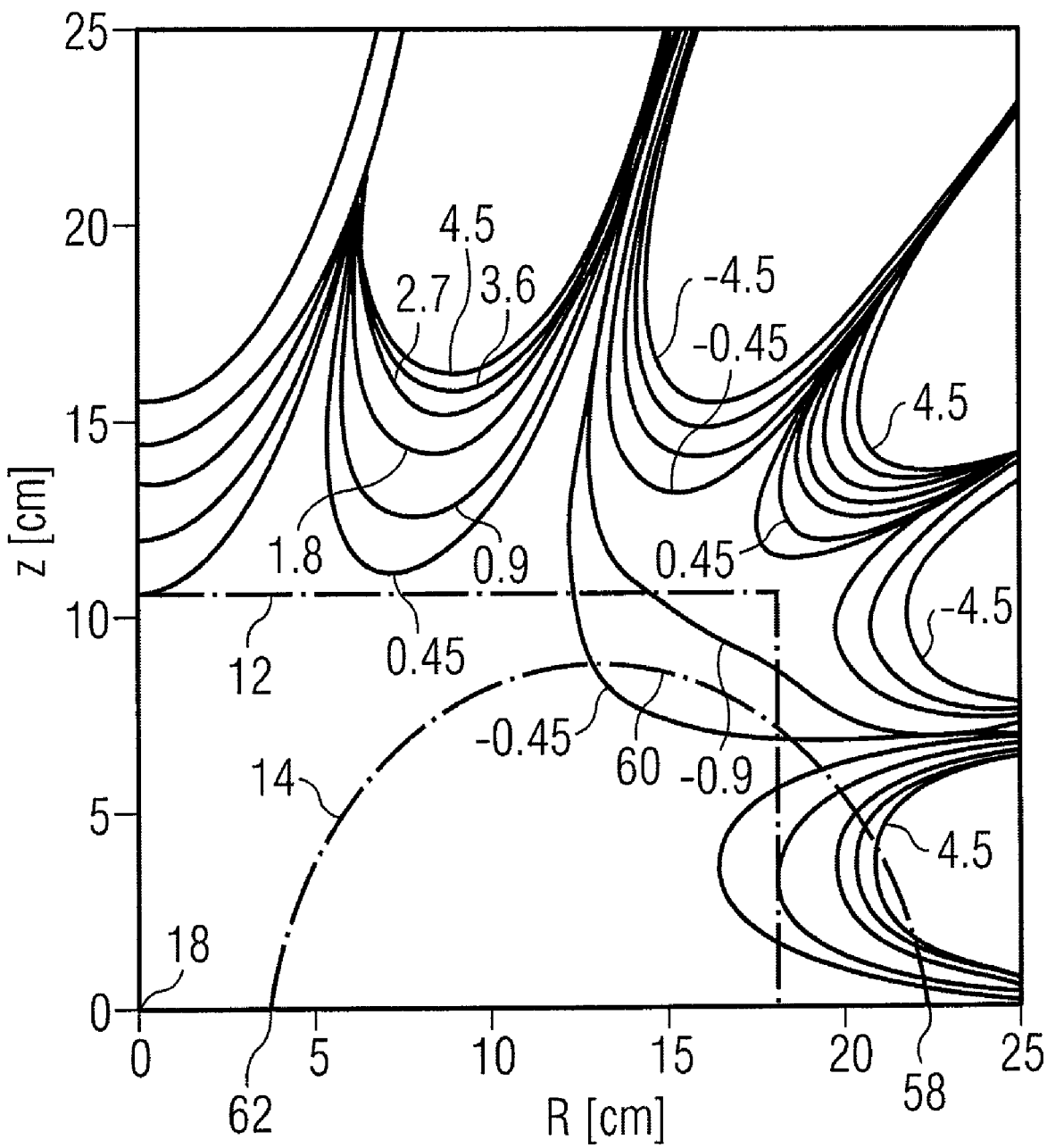
FIG. 7 shows contours of magnetic field homogeneity illustrating a substantially cylindrical imaging volume with the target toroidal imaging volume of FIG. 3.

FIG. 7 shows contours of the magnetic field homogeneity in the centre of a magnet with the shim coils of the present invention inactive, illustrating the substantially cylindrical imaging volume 12 provided by the magnet. As can be seen from the number of contour lines appearing within the toroidal imaging volume 14, the magnetic field is not sufficiently homogeneous for imaging throughout the toroidal volume 14, which represents an imaging volume required for imaging human shoulders, and other radially displaced artifacts as discussed with reference to FIG. 3.

Figure 8:
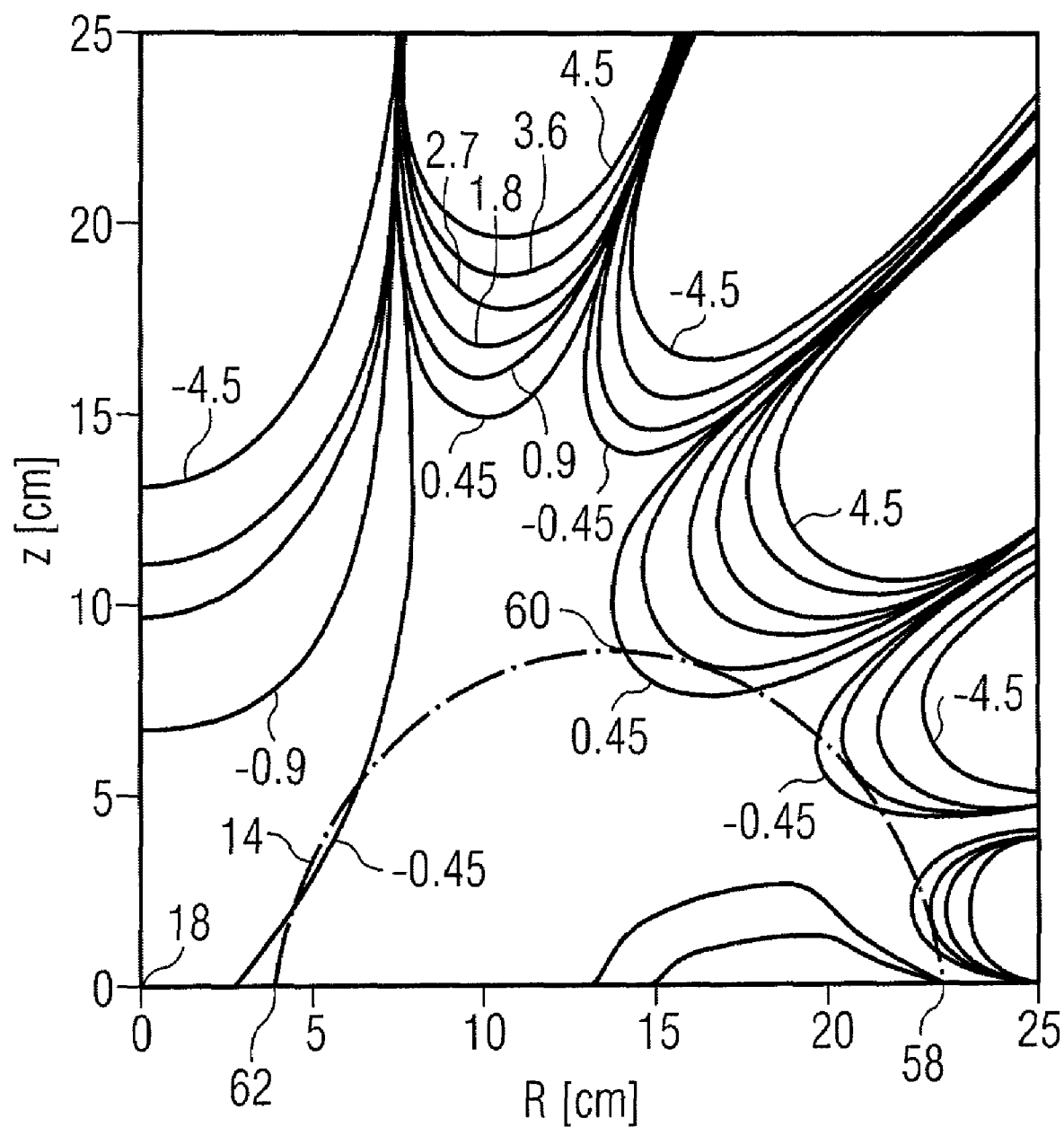
FIG. 8 shows contours of magnetic field homogeneity illustrating a toroidal imaging volume according to an embodiment of the present invention.

FIG. 8 shows the homogeneity of the magnetic field produced by the magnet of FIG. 5 with the shim coil(s) 42 of the present invention in operation, generating a magnetic field which is sufficiently homogeneous for imaging within the toroidal volume 14. As may be observed by comparing FIGS. 7 and 8, the field homogeneity in the toroidal volume 14 is improved such that imaging is possible throughout that region, while the field homogeneity at its centre 18 is degraded.

Figure 9:
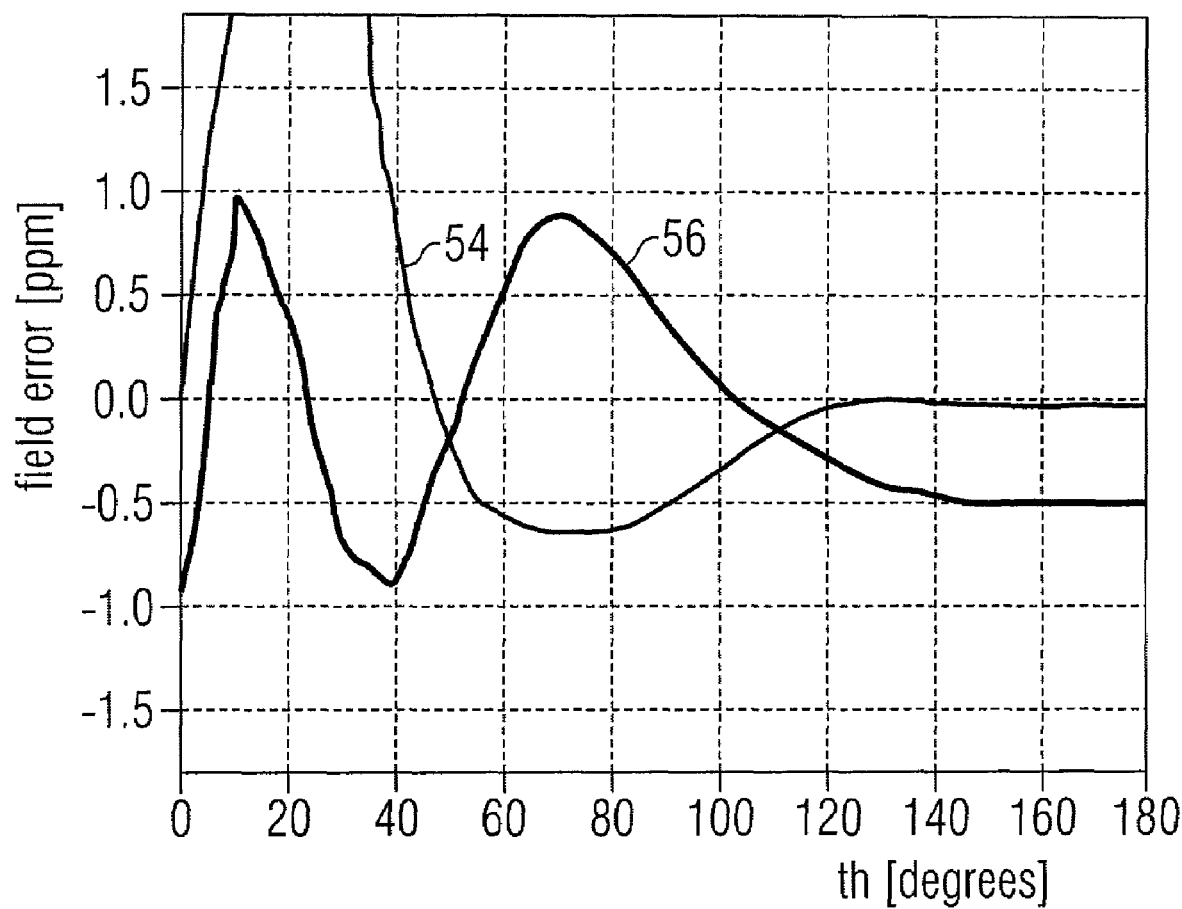
FIG. 9 shows plots of theoretical magnetic field homogeneity over the surface of the target toroidal imaging volume of FIG. 3 in a conventional MRI imaging system with a substantially cylindrical imaging region and in a MRI imaging system adapted according to the present invention.

FIG. 9 shows the magnetic field homogeneity on the surface of the toroidal imaging volume 14. Curve 54 represents the field error (deviation from a nominal value) observed around the circle shown at 14 in FIG. 7, where the shim coils of the present invention are not in operation. Curve 56 represents the field error (deviation from a nominal value) observed around the circle shown at 14 in FIG. 8, where the shim coils of the present invention are in operation. The values are shown as a function of an angle th, where 0 degrees corresponds to a point 58 on the right-hand side of the circle as shown in FIGS. 7 and 8, where x=22 cm and z=0 cm; 90 degrees corresponds to a point 60 on the upper side of the circle as shown in FIGS. 7 and 8, where x=13 cm and z=9 cm and 180 degrees corresponds to a point 62 on the left-hand side of the circle shown in FIGS. 7 and 8, where x=4 cm and z=0 cm.

The theoretical peak to peak value of inhomogeneity in the unadapted field 54 (shown cropped in FIG. 9) in the toroidal volume 14 achieves a value of about 7 ppm. This represents a magnetic field of insufficient quality to perform imaging. However, with the shim coils of the present invention in use, adaptation of the field as illustrated at 56 in FIG. 9 provides a theoretical peak-to-peak inhomogeneity of less than 2 ppm, representing a magnetic field of sufficient quality to perform imaging throughout the toroidal volume 14.

The embodiment described here requires about 3000 Ampère-meters and would yield a 1.8 ppm peak-to-peak theoretical homogeneity of the targeted toroidal volume 14. Such a shim coil arrangement can be provided by a resistive coil consuming a relatively modest amount of power (about 100 W) and will take a modest amount of space, in one embodiment being about 700 mm$^2$ in cross sectional area.

In particular, the present invention provides a shim coil set, comprising at least one shim coil, which is optimized to provide a resultant magnetic field of sufficient homogeneity to enable images to be produced in a toroidal volume 14, by adjustment of a substantially cylindrical imaging volume of lesser maximum radial diameter. It has accordingly been found relatively simple to produce the described homogeneous magnetic field in the toroidal volume 14 by use of a shim coil set on a substantially cylindrical imaging volume, thereby providing an imaging region of a required increased maximum radial diameter. Such an arrangement requires fewer and/or smaller coil windings than providing a main magnet sufficient to generate a substantially cylindrical imaging volume of the same maximum radial diameter, resulting in a more compact design. The shim coil set of the present invention is also more compact and more practical than a shim coil set which adapts a substantially cylindrical imaging region into an oblate ellipsoid imaging volume of the same maximum radial diameter as the toroidal imaging volume 14 provided by the present invention. The use of a toroidal imaging volume 14 is useful in producing images of shoulders, hips, breasts and other radially displaced features in human, animal or inanimate subjects, wherein the degradation of the field homogeneity at the centre 18 of the volume is not significant to the required imaging. The shim coil(s) of the present invention may be activated to provide the described toroidal imaging volume 14, and deactivated to provide the conventional cylindrical imaging volume 12, according to the required imaging.

Accordingly, the invention enables the imaging of parts of a human, or other, body which are beyond the maximum radial diameter of the designed imaging volume of a particular MRI imaging system, by the addition of one or more relatively compact shim coils 42.

Electromagnetic shims (also known as e-shims) are known. Such e-shims are provided to modify the whole imaging region of an MRI system, and are provided to counteract deficiencies in the homogeneous field produced by the main magnet of an MRI system and to compensate for the distortion of the magnetic field due to the diamagnetism of the subject being imaged. For example, superconducting magnets usually have some low-order inhomogeneities due, for example, to temperature variations, or $Z_2$ drift. Such variations are time-variant and so are not suitable to be shimmed by passive shimming. Rather, electric current through the e-shims is adjusted to compensate for a current field inhomogeneity. Such e-shims are usually of resistive conductors, and are connected to a power source whenever the imaging system is in use.

The shim coils provided by the present invention, on the other hand, do not seek to improve upon the basic homogeneity of the magnet. Indeed, the effect of the shim coils of the present invention may well be to degrade the overall magnetic field homogeneity. Rather, the present invention enables the region in which homogeneity is sufficient for imaging to be extended to a wider maximum radial diameter, sufficient to accommodate a part of a subject which lies outside of the imaging volume provided without operation of the shim coils of the present invention. Homogeneity at the centre of the imaging region may degrade as a result. The shim coils of the present invention adapt the high order harmonics of the magnetic field, not the low-order harmonics responsible for basic field homogeneity. In an example of the present invention, shim coils intended to provide a toroidal imaging volume sufficient to image shoulder joints in adult humans target only very high harmonic orders, of $Z_{18}$ and above, which are required in order to truncate an imaging volume and extend it radially outside of its design volume.

In practice, the design of the shim coil(s) of the present invention may proceed as follows.

A designer has available the dimensions and magnetic field characteristics of an MRI system. In particular, the designer will have available the harmonic composition of the magnetic field produced by the system. This information will be provided to an optimizer program such as a constrained linear optimizer, well known in itself to those skilled in the art. The designer then provides the optimizer program the position and dimensions of the required toroidal imaging volume, and the available positions (such as radii of inner and outer surfaces of the gradient coil assembly 38, and available axial locations) for placement of shim coils of the present invention. The designer also provides the optimizer program with the maximum allowable inhomogeneity within the toroidal imaging volume, and the maximum allowable current density for the shim coils of the invention. The optimizer uses all of this information to derive optimized coil positions and dimensions for providing a toroidal imaging region of the required dimension and quality inside the described MRI system.

The optimum position and size of the shim coils of the present invention will be different for each system, and according to the required dimensions and quality of the toroidal imaging region. However, the following example illustrates a method for designing a set of optimized shim coils according to the present invention which have been determined to work, and to produce a useful toroidal imaging volume 14.

In a specific example, the toroidal shim of the present invention is an axially symmetric set of coils, which are wound on the gradient coil assembly. The coil windings should preferably fit in the gradient coil assembly, and typically occupy very little radial space. This greatly simplifies their design and construction.

The external radius of the toroidal volume 14 may be 190 mm and the internal radius may be 80 mm, for example, although other dimensions could be selected as appropriate for the intended application.

In certain embodiments, it is preferred that dissipation of the toroidal shim should be less than 1 kW and the operating current should be 10 A, since operation within these limits will ensure that an existing power supply unit for active shims may be used. Of course, other embodiments may be developed with operating parameters outside of these limits, if a different power supply unit is provided.

An example of the design procedure for designing a toroidal shim of the present invention will now be described. A number of design tools have been written to design the toroidal shim, using MATLAB® software (which is available from The MathWorks Inc, 3 apple Hill Drive, Natick Mass., USA www.mathworks.com), although other software packages, familiar to those skilled in the art, could be used.

The design starts off as a design of coils without significant radial width, such that the toroidal shim consists of coils having a radial width which is far less than their radius.

Given the design harmonics of the magnet, and given the inner and outer radii of the body or gradient coil assembly, and the axial space available for the toroidal shim, an array of centroids are defined, each defined by a radius and an axial coordinate. This may be done by a MATLAB® tool, a layout tool, written for the purpose. The maximum current density is defined directly, which is determined by the maximum current rating of the available power supply unit, the axial width of the wire and the number of layers that can be accommodated within the available space.

In another MATLAB® tool, a design tool, written for the purpose, a number of target points are defined on the surface of the target toroidal volume. Also defined is a target peak to peak variation on the magnetic field, which may for example be set at 2 ppm.

The design tool calculates a current for each centroid, such that the total amount of Ampere-turns required is minimized, constrained by a maximum current limit defined by the available power supply unit. This particular tool employs a linear optimization method, but other methods, familiar to those skilled in the art, may alternatively be used.

Feasible solutions from the design tool in general consist of clusters of current density at the maximum allowable positive current and/or the maximum allowable negative current. Such a solution is illustrated in FIG. 6. From the design tool solution, coil blocks may be defined manually to have radial and axial dimensions which are multiples of the radial and axial width of a chosen wire, and which approximate the results from the design tool as closely as possible.

The dimensions of these blocks are entered to an optimizer tool written for the purpose, which serves to find an optimum b1 (axial coordinate of the side of a coil block, nearest to the midplane) and b2 (axial coordinate of the side of a coil block, furthest from the midplane, for each coil block). Next, the number of turns of each coil will be rounded to an integer value, and the axial position of each coil block will be optimized to give a result, in terms of axial harmonics, which most closely matches the results from the design tool.

This design process will now be illustrated with the design of a toroidal shim for a certain cylindrical magnet. A number of centroids were defined, some of them at a first radius suitable for mounting on the inner surface of the gradient coil assembly and within a first axial range, which may be symmetric about the mid-plane of the magnet, and some spaced on a second radius suitable for mounting on the outer surface of the gradient coil assembly and within a second axial range, which may be symmetric about the mid-plane of the magnet, and which may overlap the first axial range.

In running the design tool, a toroidal volume was targeted with an outer radius of 130 mm and an inner radius of 95 mm, although other radii could have been chosen according to the intended application. The optimum peak-to-peak inhomogeneity which could be achieved was 2.1 ppm, compared with 7.3 ppm for the same region in the absence of the toroidal shim of the present invention.

Figure 10A:
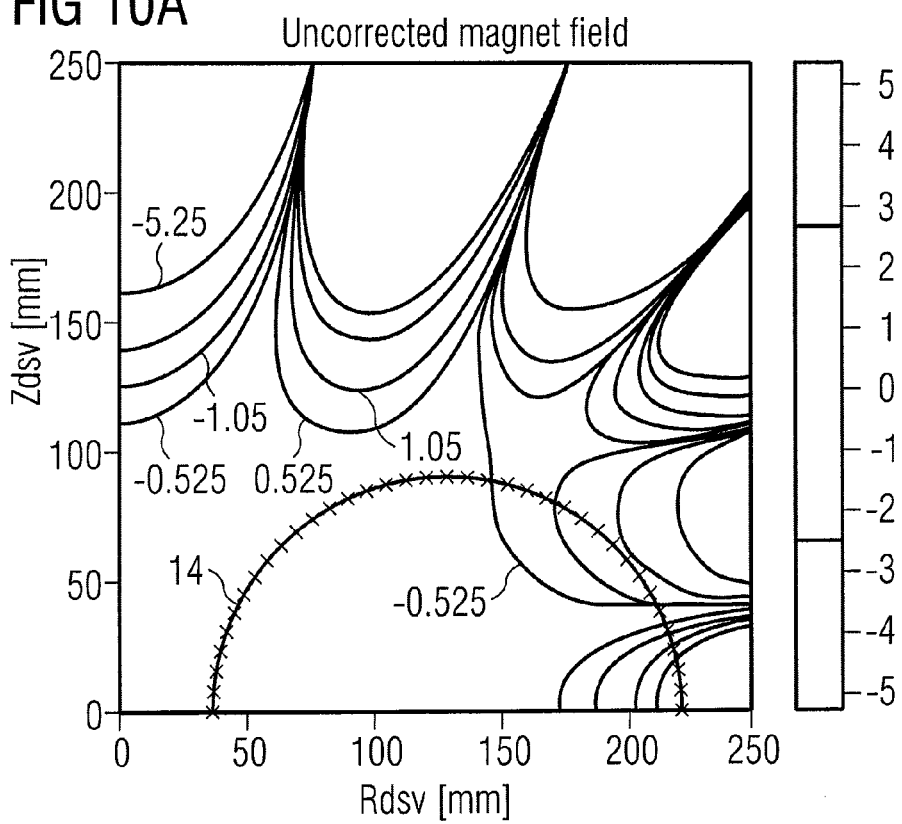
FIGS. 10A and 10B show the improvement in magnetic field homogeneity within a toroidal volume by use of an active shim according to an embodiment of the present invention.
Figure 10B:
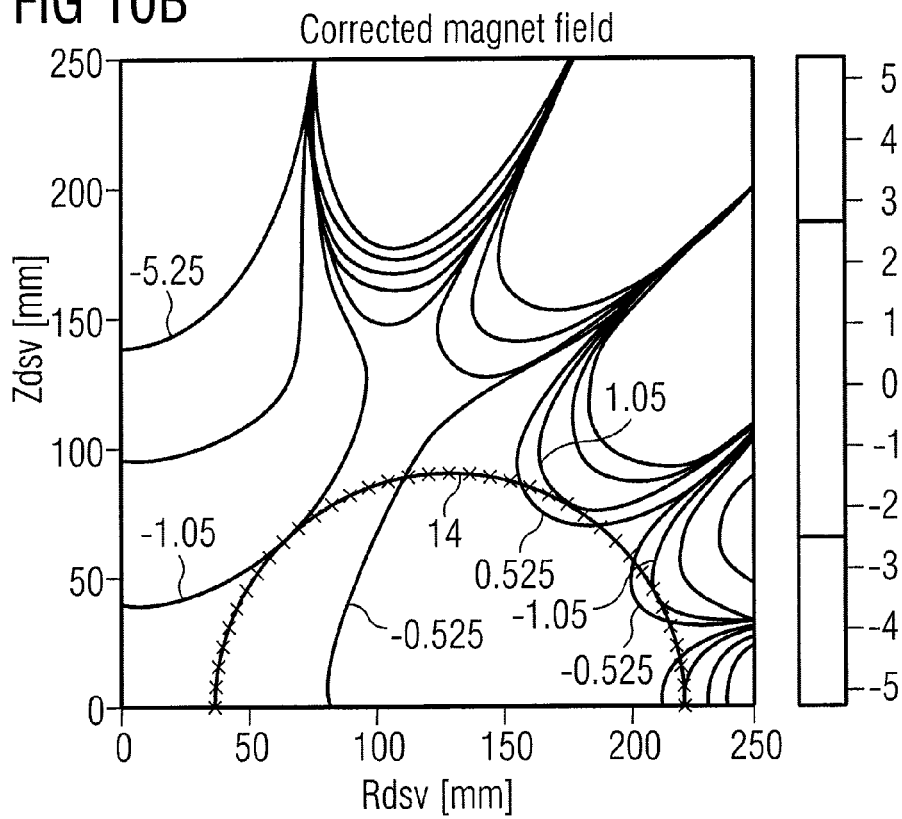
Figure 11A:
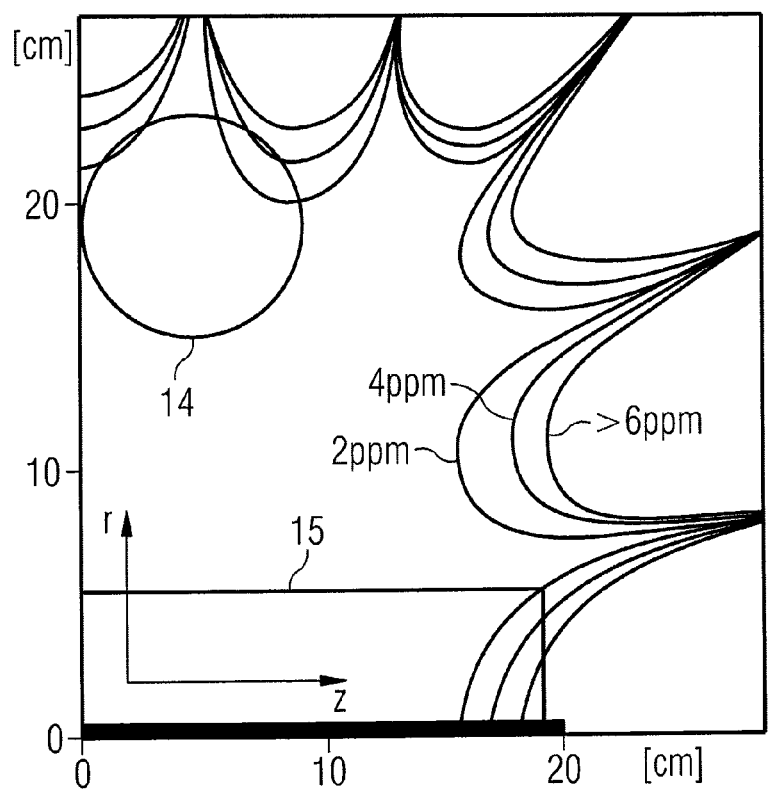
FIGS. 11A and 11B show the improvement in magnetic field homogeneity within a toroidal volume by use of an active shim according to another embodiment of the present invention.
Figure 11B:
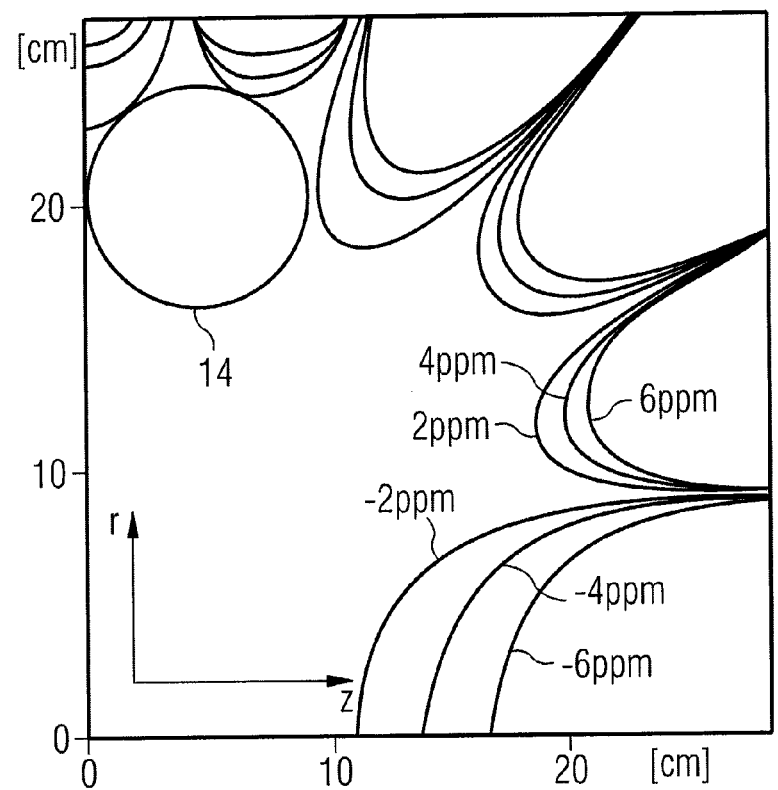

The resultant design in the present example is found to provide a good improvement in the homogeneity of the toroidal volume, as can be seen in FIGS. 10A-10C. The toroidal volume in the present example is offset from the centreline of the magnet in the Z direction. FIG. 11B shows the expected performance of the example toroidal shim when operated with positive and negative currents of +10 A and −10 A respectively, on a magnet producing the field of FIG. 11A with the toroidal shim inoperative.

Figure 12:
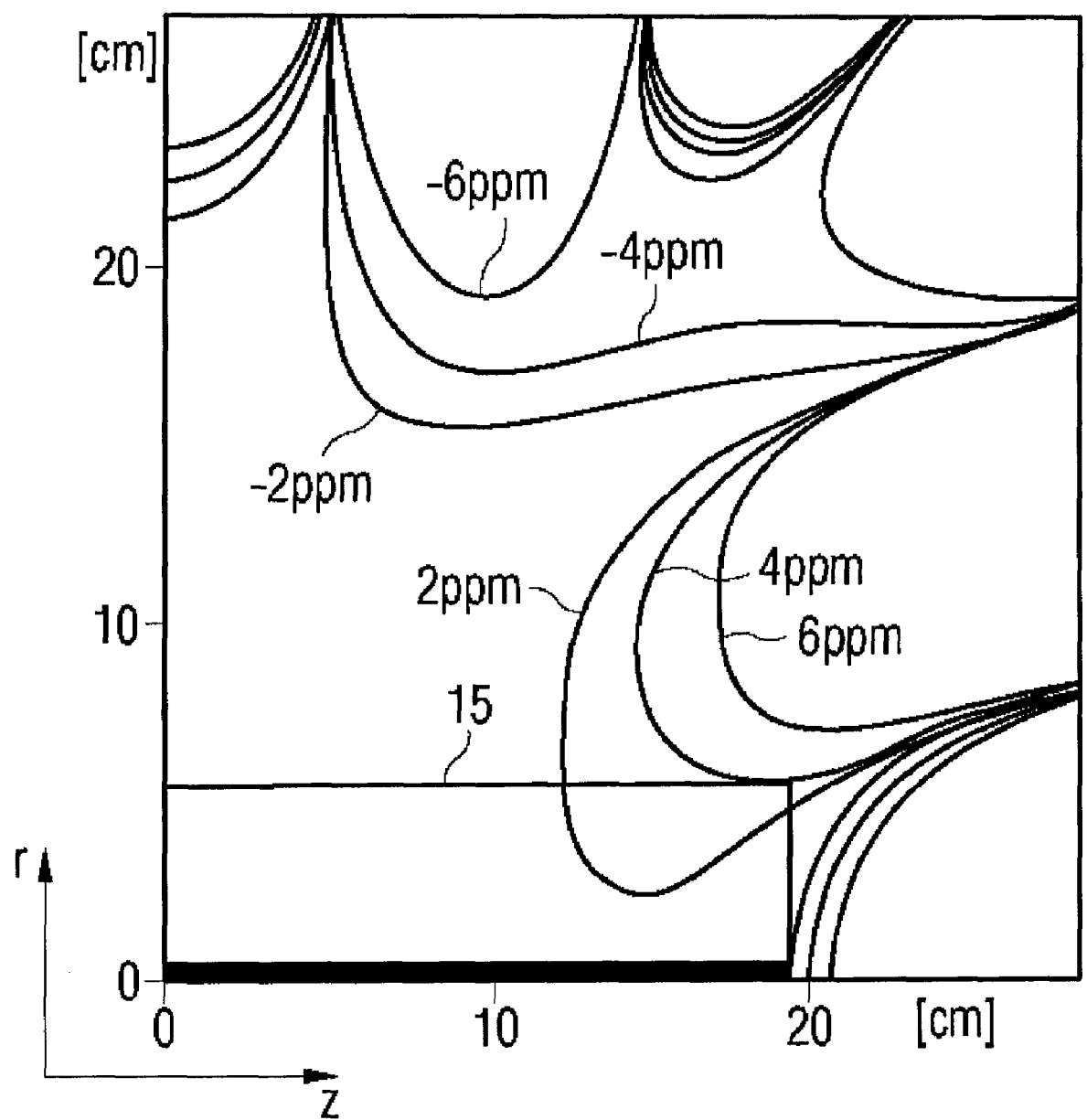
FIG. 12 shows the improvement in magnetic field homogeneity within an axially elongate volume by use, in a reverse direction, of an active shim according to the present invention.

A further advantage of this particular embodiment of the toroidal shim of the present invention is that a negative excitation, that is, reversing the direction of the current in each coil of the toroidal shim, will result in a marked improvement of magnetic field homogeneity in a spine imaging volume 15, as is shown in FIG. 12.

The present invention accordingly provides an active shim coil, preferably an axisymmetric shim coil, which acts to improve the magnetic field homogeneity of an axisymmetric toroidal region of greater maximum diameter than a nominal cylindrical imaging region, thus addressing the drawback of a limited radial width of a magnet design with a cylindrical imaging volume. The toroidal shim coil of the present invention represents a compromise between restricting imaging to the designed substantially cylindrical imaging region 12, and providing shims sufficient to create a whole elliptical imaging volume 10 from a designed cylindrical imaging volume 12. Such shims have been found to be impractically large. The human anatomy is such that radial extremities such as shoulders may be imaged without requiring imaging of the centre of the imaging volume. Accordingly, the toroidal imaging volume provided by the toroidal shim of the present invention is found to be effective in enabling imaging of various radially-displaced features which are conventionally difficult to locate in the imaging region.

The shim coils of the present invention are preferably embodied as resistive coils, which are simple to turn on and off according to the desired imaging procedure.

While the shim arrangement of the present invention has been described as discrete shim coils provided for the purpose of the present invention, the shimming arrangement embodied above as one or more of the shim coils may in fact be provided by providing additional current flow through one or more of the coils provided within the MRI system for other reasons.

The invention claimed is:

1. An arrangement for producing a substantially toroidal imaging region in a magnetic resonance imaging (MRI) system, comprising:
   a solenoidal magnet arrangement (30) comprising primary magnet coils (32) arranged symmetrically about an axis (A-A);
   characterized in that a shim arrangement (42) is provided, such that the MRI system provides a first imaging region (12) of first maximum radial (r) diameter with the shim arrangement inoperative, and provides a second imaging region (14) of substantially toroidal shape and of a second maximum radial (r) diameter, greater than the first, with the shim arrangement operative in a forward direction, such that magnet field homogeneity within the second imaging region is improved by operation of the shim arrangement, while field homogeneity at the centre (18) of the second imaging region is degraded by operation of the shim arrangement.

2. An arrangement according to claim 1 wherein the first imaging region (12) has a first maximum axial (z) length with the shim arrangement inoperative, and provides a third imaging region (15) of a second axial (z) length, greater than the first, with the shim arrangement operative in a reverse direction, such that magnet field homogeneity within the third imaging region is improved by operation of the shim arrangement in the reverse direction.

3. An arrangement according to claim 1 wherein the first imaging region is of substantially cylindrical shape.

4. An arrangement according to claim 1 wherein the shim arrangement comprises an arrangement for providing additional current flow through a coil provided within the MRI system for other reasons.

5. An arrangement according to claim 1 wherein the shim arrangement comprises a shim coil set, comprising a number of shim coils (42) arranged symmetrically about the axis.

6. An arrangement according to claim 5 wherein, in operation, at least one coil of the shim coil set carries electric current in a direction opposite to that of an electric current carried by at least one other coil of the shim coil set.

7. An arrangement according to claim 5, wherein the shim coil set comprises coils (42) of at least two differing internal radii (r1, r2).

8. An arrangement according to claim 7, further comprising a cylindrical gradient coil assembly (38), and wherein the differing internal radii (r1, r2) are provided by arranging respective shim coils on radially inner and outer surfaces of the gradient coil assembly.

9. An arrangement according to claim 5 wherein the shim coil set comprises at least one saddle coil.

10. An arrangement according to claim 5 wherein the primary magnet coils (32) are located within a hollow cylindrical cryostat and wherein the shim coil set is located within the bore of the cryostat (36).

11. An arrangement according to claim 10 wherein active shielding coils (34) are provided, arranged on a former within the cryostat (36).

* * * * *